United States Patent
Karis et al.

(10) Patent No.: US 9,312,141 B2
(45) Date of Patent: Apr. 12, 2016

(54) VAPOR PHASE CHEMICAL MECHANICAL POLISHING OF MAGNETIC RECORDING DISKS

(71) Applicant: HGST Netherlands B.V., Amsterdam (NL)

(72) Inventors: Thomas E. Karis, Aromas, CA (US); Bruno Marchon, Palo Alto, CA (US); Bala K. Pathem, Fremont, CA (US); Franck D. Rose dit Rose, San Jose, CA (US); Kurt A. Rubin, San Jose, CA (US); Erhard Schreck, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 14 days.

(21) Appl. No.: 14/086,927

(22) Filed: Nov. 21, 2013

(65) Prior Publication Data

US 2015/0136730 A1 May 21, 2015

(51) Int. Cl.
| | |
|---|---|
| *H01L 21/302* | (2006.01) |
| *H01L 21/306* | (2006.01) |
| *B81C 1/00* | (2006.01) |
| *H01L 21/321* | (2006.01) |
| *G11B 5/84* | (2006.01) |
| *B24B 37/04* | (2012.01) |

(52) U.S. Cl.
CPC ........ *H01L 21/30625* (2013.01); *B24B 37/048* (2013.01); *B81C 1/00* (2013.01); *G11B 5/8408* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 4,861,662 A | 8/1989 | Kobliska et al. |
| 5,599,590 A | 2/1997 | Hayashi et al. |
| 5,618,639 A | 4/1997 | Ohno et al. |
| 5,709,754 A | 1/1998 | Morinville et al. |
| 6,031,229 A | 2/2000 | Keckley et al. |
| 6,299,946 B1 | 10/2001 | Toyoguchi et al. |
| 6,303,214 B1 | 10/2001 | Chour et al. |
| 6,335,063 B1 | 1/2002 | Chen et al. |
| 6,436,194 B1 | 8/2002 | Carlson et al. |
| 6,503,405 B1 | 1/2003 | Chen |

(Continued)

FOREIGN PATENT DOCUMENTS

| | | |
|---|---|---|
| JP | 6470921 A | 3/1989 |
| JP | 2027522 A | 1/1990 |

(Continued)

OTHER PUBLICATIONS

Kainuma, K. et al., "Aluminum Substrate for 3.5-inch 1 TB Magnetic Recording Media," Fuji Electric Review, vol. 57, No. 2, 2011, pp. 62-66.

(Continued)

*Primary Examiner* — Jiong-Ping Lu
(74) *Attorney, Agent, or Firm* — Zilka-Kotab, PC

(57) ABSTRACT

A method for polishing a carbon overcoat of a magnetic media that results in a smooth surface free of carbon cluster debris. The method involves forming a magnetic disk having a carbon overcoat formed thereon. The carbon overcoat is then polished in the presence of ozone ($O_3$). The heat from the polishing process along with the presence of the ozone, cause any carbon particles removed by the polishing to form $CO_2$ gas so that there is no remaining carbon particle debris on the surface of the disk.

16 Claims, 5 Drawing Sheets

(56) References Cited

U.S. PATENT DOCUMENTS

| | | |
|---|---|---|
| 6,572,934 B2 | 6/2003 | Watanabe et al. |
| 6,589,353 B1 | 7/2003 | Chen et al. |
| 6,589,641 B1 | 7/2003 | Stirniman et al. |
| 7,488,429 B2 | 2/2009 | Okawa et al. |
| 7,961,427 B2 | 6/2011 | Dorbeck et al. |
| 8,113,017 B2 | 2/2012 | Kawai et al. |
| 2008/0261401 A1* | 10/2008 | Kerr et al. ............ 438/693 |
| 2012/0325771 A1 | 12/2012 | Bian et al. |
| 2013/0161181 A1 | 6/2013 | Guo et al. |

FOREIGN PATENT DOCUMENTS

| | | | | |
|---|---|---|---|---|
| JP | 2037524 A | | 2/1990 | |
| JP | 3286425 A | | 12/1991 | |
| JP | 4006624 | | 1/1992 | |
| JP | 4212715 A | | 8/1992 | |
| JP | 05028478 | | 2/1993 | |
| JP | 06-126619 | * | 5/1994 | ............ B24B 53/00 |
| JP | 7210850 A | | 8/1995 | |
| JP | 2532683 B2 | | 6/1996 | |
| JP | 8306040 A | | 11/1996 | |
| JP | 09-027121 | * | 1/1997 | ............ G11B 5/84 |
| JP | 9027121 A | | 1/1997 | |
| JP | 2000282238 A | | 10/2000 | |
| JP | 2005158092 A | | 6/2005 | |
| JP | 2010086586 A | | 4/2010 | |

OTHER PUBLICATIONS

Guo et al., U.S. Appl. No. 13/333,946, filed Dec. 21, 2011.
Non-Final Office Action from U.S. Appl. No. 13/333,946, dated Aug. 14, 2014.
Non-Final Office Action from U.S. Appl. No. 13/333,946, dated Jan. 23, 2015.
Non-Final Office Action from U.S. Appl. No. 13/333,946, dated Mar. 21, 2014.
Final Office Action from U.S. Appl. No. 13/333,946, dated Jun. 13, 2014.
Final Office Action from U.S. Appl. No. 13/333,946, dated May 7, 2015.

* cited by examiner

VAPOR PHASE CHEMICAL MECHANICAL POLISHING OF MAGNETIC RECORDING DISKS

FIELD OF THE INVENTION

The present invention relates to magnetic data recording and more particularly to a method for polishing a carbon surface that prevents the formation of carbon clusters, resulting in improved surface smoothness and uniformity.

BACKGROUND OF THE INVENTION

A key component of most computers is an assembly that is referred to as a magnetic disk drive, or hard disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). When the slider rides on the air bearing, the write and read heads are employed for writing magnetic impressions to and reading magnetic impressions from the rotating disk. The read and write heads are connected to processing circuitry that operates according to a computer program to implement the writing and reading functions.

Perpendicular magnetic recording, wherein the recorded bits are stored in a perpendicular or out-of plane orientation in the recording layer, is a promising path toward ultra-high recording densities in magnetic recording hard disk drives. One type of perpendicular magnetic recording system is a system that uses a dual layer media. The dual layer media includes a perpendicular magnetic data recording layer formed on a soft or relatively low coercivity magnetically permeable under-layer. The under-layer serves as a flux return path for the field from the write pole to the return pole of the recording head. The magnetic transitions between adjacent oppositely directed magnetized regions are detectable by the read element or head as the recorded bits.

Magnetic media needs to be made ever smoother for improved reliability and reduced head media spacing. Disk surface roughness can derive from the columnar grains of the perpendicular magnetic recording layer. From the top, the grains resemble the sealed cells of a wasp nest, with the center protruding above the surrounding interfacial layer. The surface of the media can be covered with a protective overcoat that can be formed of carbon. Current methods for smoothing the surface result in defects and corrugations that negatively affect the performance and reliability of the magnetic data recording system. Therefore, there remains a need for a method for manufacturing a magnetic recording medium that can produce a reliably smooth and flat surface on the media.

SUMMARY OF THE INVENTION

The present invention provides a method for manufacturing a magnetic media for magnetic data recording that includes forming a disk having a magnetic recording layer and a carbon overcoat formed over the magnetic recording layer. The carbon overcoat is then polished while exposing the surface of carbon overcoat layer to ozone.

The presence of the ozone, along with heat generated by the polishing, advantageously causes any carbon particles removed by the polishing to form $CO_2$ gas, rather than being left behind as carbon nano-cluster debris. This, thereby, achieves a much smoother surface on the magnetic media than would otherwise be possible. The process can be used with either a carbon overcoat that has previously been oxidized or a non-oxidized carbon overcoat. In addition, the polishing can be performed as a dry polishing without the need for a slurry such as would be needed for a chemical mechanical polishing.

These and other features and advantages of the invention will be apparent upon reading of the following detailed description of preferred embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
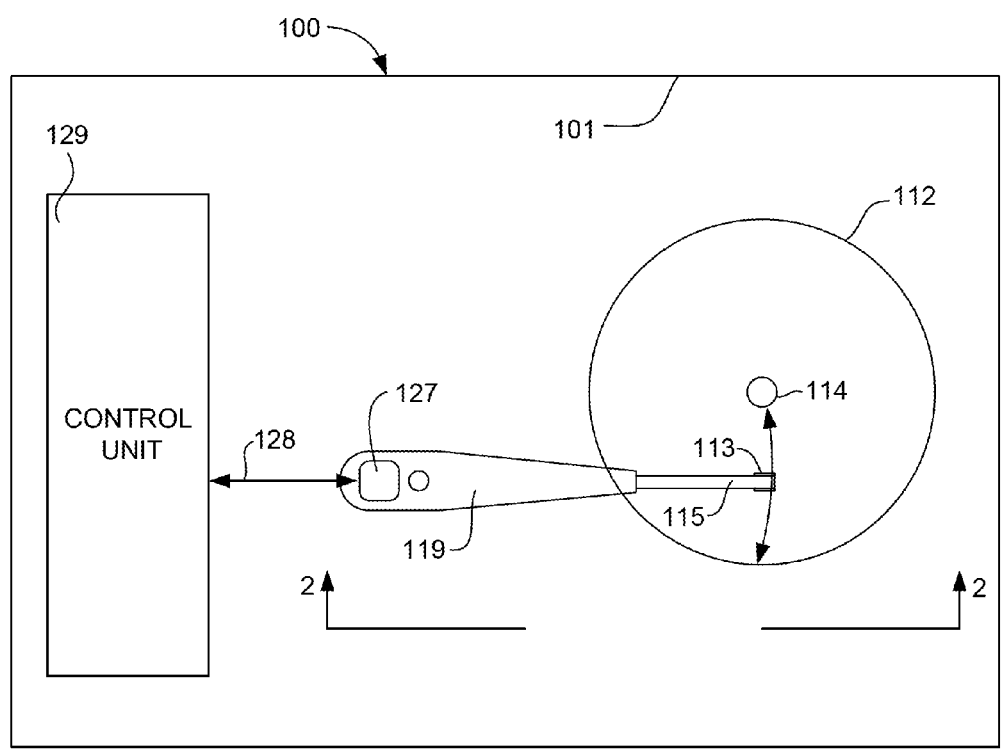
FIG. 1 is a schematic illustration of a magnetic disk drive system.

Referring now to FIG. 1, there is shown a disk drive 100 embodying this invention. The disk drive 100 includes a housing 101. At least one rotatable magnetic disk 112 is supported on a spindle 114 and rotated by a disk drive motor (not shown). The magnetic recording on each disk 112 is in the form of annular patterns of concentric data tracks (not shown) on the magnetic disk 112.

At least one slider 113 is positioned near the magnetic disk 112, each slider 113 supporting one or more magnetic head assemblies. As the magnetic disk rotates, slider 113 moves in and out over the surface of the disk 112 so that the magnetic head assembly formed on the slider 113 can access different tracks of the magnetic disk where desired data are written. Each slider 113 is attached to an actuator arm 119 by way of a suspension 115. The suspension 115 provides a slight spring force which biases slider 113 against the surface of the disk 112. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals 128 supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals and head position and seek control signals.

Figure 2:
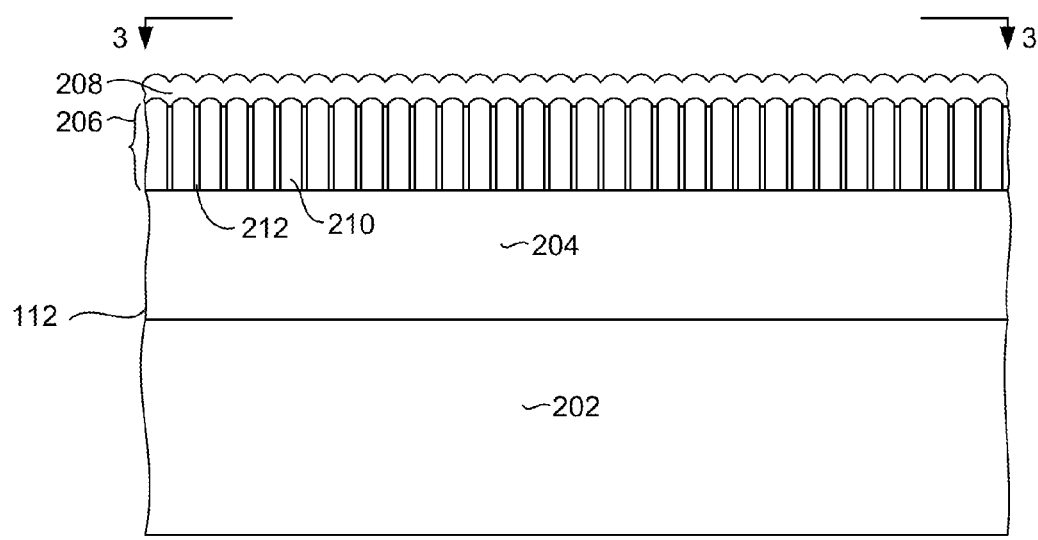
FIG. 2 is an enlarged cross-sectional view of a portion of a magnetic media for data recording.
Figure 3:
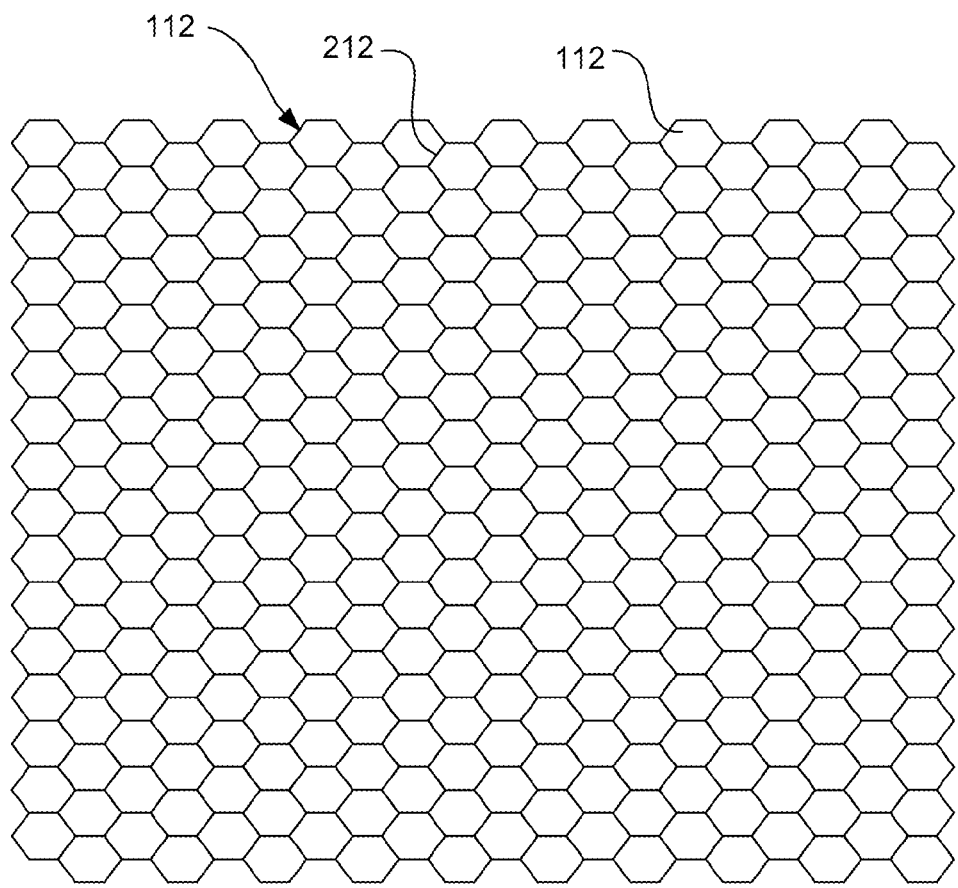
FIG. 3 is a top down view of a portion of the magnetic media as seen from line 3-3 of FIG. 2.

FIGS. 2 and 3 show enlarged views of a magnetic media disk 112 prior to a polishing process that will be described herein below. FIG. 2 shows a cross sectional view of the magnetic media 112 and FIG. 3 shows a top down view as seen from line 3-3 of FIG. 2. With reference to FIG. 2, the magnetic media 112 includes a substrate 202, which can be a material such as glass or AlMg. A soft magnetic layer 204 is formed over the substrate 202. The soft magnetic layer 204 is a magnetic material having a relatively low magnetic coercivity such as CoPtCr alloy, which can provide a return path for a magnetic write field. A magnetic write layer 206 is formed over the soft magnetic layer 204, and a protective overcoat 208 is formed over the magnetic write layer 206. The protective overcoat is preferably a layer of carbon.

The magnetic write layer 206 can be constructed as a self assembled layer of magnetic grains 210 separated by non-magnetic oxide layers or nucleation layers 212. The individual magnetic grains 210 are constructed of a magnetic material having a high magnetic coercivity, such as CoPtCrO, and the nucleation layer 212 can be a non-magnetic material such as Ru or RuO. FIG. 3, shows how the magnetic grains 110 are surrounded by the non-magnetic oxide layers 212 in a manner that resembles honeycomb cells.

With reference again to FIG. 2, it can be seen that the magnetic grains 210 extend upward beyond the surrounding non-magnetic oxide boundaries 212. Also, the grains 210 may have a rounded shape at their upper ends that causes them to extend even further beyond the non-magnetic boundaries 212. This causes the overlying protective layer 208 to have rough upper surface as shown.

For improved reliability and maximum performance it is desirable that the surface of the media 112 (i.e. the surface of the protective layer 208) be as smooth as possible. Such smoothness is desirable to prevent head disk contact during operation, which can damage the magnetic read and write elements of the slider 113 (FIG. 1). In addition, a smooth surface reduces magnetic spacing. Magnetic performance drops off exponentially with increased magnetic spacing, so reducing the magnetic spacing is very important to maximizing performance.

One way to provide a smooth surface is to polish the surface after the protective carbon overcoat 208 has been deposited. This polishing can be performed using an abrasive tape. However, the use of such polishing results in the formation of carbon nano-clusters left over as polishing wear debris on the surface of the media 112. Air shear from the disk test slider forms a corrugation of debris which manifests itself in the form of low frequency spacing modulation of the air bearing slider over the disk. Therefore, it is desirable to implement a polishing process in a manner that does not result in the formation of such carbon nano-clusters.

The inventors have found, surprisingly, that applying ozone ($O_3$) to the surface of the disk 112 during polishing causes carbon removed by the polishing to convert to a $CO_2$ gas rather than forming carbon nano-clusters. Therefore, in this way, the carbon worn away by polishing is removed from the disk surface by immediately converting the worn carbon overcoat debris into a gaseous phase. This process can be referred to as vapor phase chemical mechanical polishing (vapor phase CMP). An advantage of this process is that it can be performed as a dry process. This eliminates the need for a wet chemical mechanical polishing or reactive ion etching, both of which present their own challenges. For example, the use of slurry in a typical chemical mechanical polishing process results in slurry particles remaining on the surface, thereby requiring additional process time and cleaning equipment and the resulting additional manufacturing cost. Also, chemical mechanical polishing and reactive ion etching have been shown to remove too much carbon overcoat or leave behind certain types of high or low aspect ratio defects, making their polishing of bit patterned media incomplete.

The above described process can be used in conjunction with a process whereby prior to polishing, the carbon overcoat 208 is partially oxidized. This can be accomplished by exposing the carbon overcoat 208 to ozone ($O_3$) prior to polishing. This ozone exposure is separate from the above described ozone exposure performed during and simultaneously with the polishing. This pre-polishing oxidation process results in partial oxidation on the upper surface of the overcoat 208. The partially oxidized carbon, when polished away in the presence of air/oxygen sublimates to become a $CO_2$ gas rather than forming carbon particles that remain on the disk. This elimination of carbon particles from the surface of the overcoat 208 reduces flying height modulation defects. The improvement is even more significant for thinly lubricated overcoats (which have a higher wear rate), and overcoats which have not already been partially oxidized by exposure to ozone (i.e. by a first ozone exposure).

The first exposure to ozone involves exposing the carbon overcoat 208 to concentrated ozone at ambient temperature (i.e. without the application of additional heat) for an extended period of time and prior to polishing. As discussed above, this results in oxidation of the upper surface of the carbon overcoat 208. The second exposure is performed at an elevated temperature which assists in the conversion of C to $CO_2$ during polishing, and is performed during polishing. The applied heat can come from the friction induced heating resulting from the polishing itself. Therefore, tribo-heating from the polishing process itself can be used to achieve the elevated temperature, without the need for additional heating.

The polishing in the presence of ozone can be accomplished by enclosing the whole disk 112 and polishing assembly inside of an enclosure filled with concentrated ozone. Preferably, a stream of moderately concentrated ozone can be directed into the interface between the tape and the disk throughout the polishing pass. Residual ozone can be collected by an adjacent ventilation duct.

Figure 4:
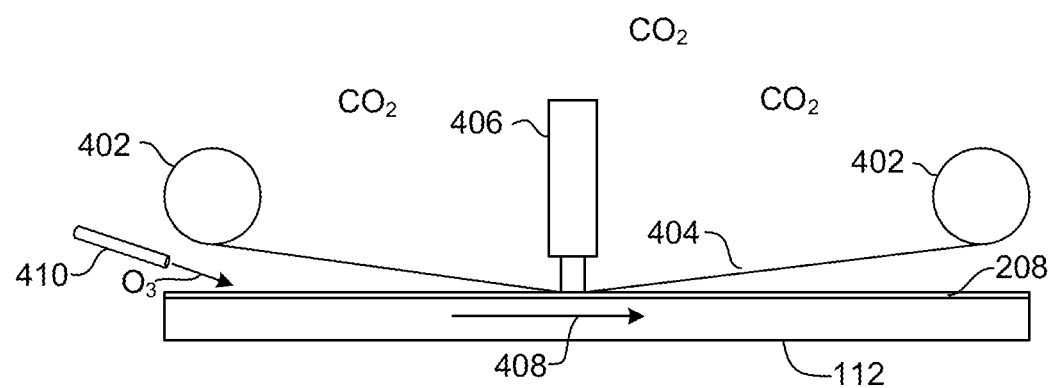
FIG. 4 is a schematic illustration of a method for polishing a magnetic media.

This process is represented schematically with reference to FIG. 4. FIG. 4 shows a disk 112 having a protective overcoat 208 formed thereon. A pair of tape reels 402 are provided having an abrasive tape 404 spooled thereon and spanning between the tape reels 402. A pressure pad 406 can also be provided for applying pressure to press the tape against the surface of the disk 112. The direction of the disk in FIG. 4 is indicated by arrow 408. An outlet 410 is provided for supplying a stream of ozone gas $O_3$ to the surface of the disk 112. The outlet is preferably arranged so that the ozone ($O_3$) is supplied upstream of the pressure pad 406 relative to the direction of travel 408 of the disk. As the abrasive tape 404 polishes the carbon overcoat 208 of the disk 112 in the presence of the ozone $O_3$, small particles of carbon are removed by the tape 404. The friction of the tape 404 against the carbon overcoat 112 tribologically heats the overcoat 208. The resulting heat and presence of ozone $O_3$ causes the removed particles to be converted into $CO_2$ gas.

Figure 5:
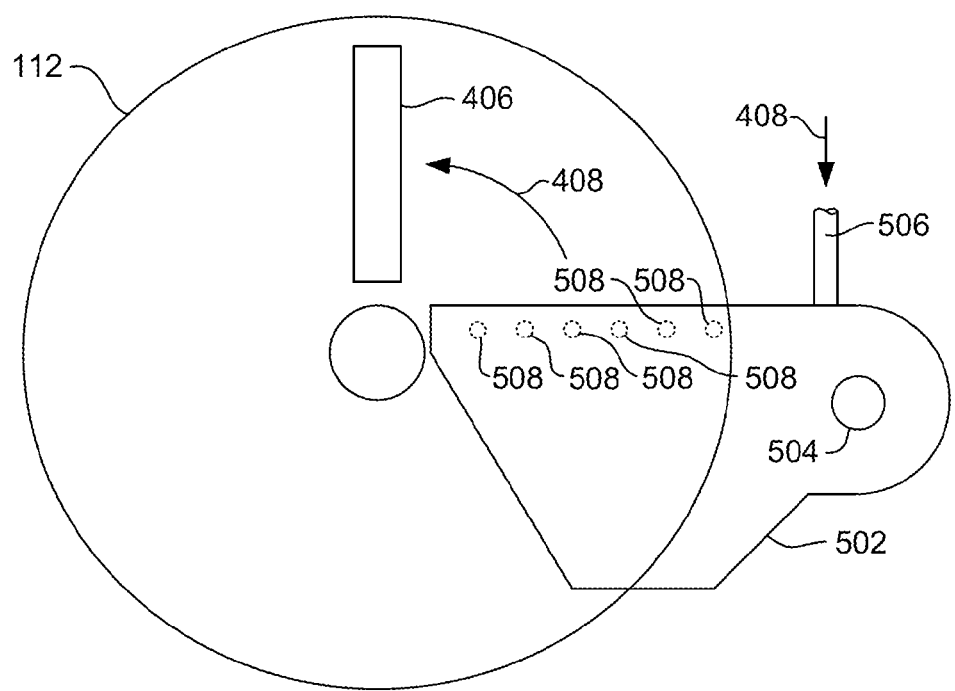
FIG. 5 is a schematic illustration of a mechanism for applying ozone to a magnetic media while polishing the magnetic media.

FIG. 5 is a top down view illustrating one possible apparatus for delivering ozone to the surface of the disk 112 during polishing as described above. FIG. 5 shows a disk 112 rotating in a counterclockwise direction as indicated by arrow 408. A pressure pad 406 indicates a location of application of polishing pressure on the surface of the disk 112. An injector plate 502 is provided for supplying ozone to the surface of the disk 112. As can be seen, the injector plate 502 can be rotatably mounted at a pivot point 504 for moving the injector plate 502 over the surface of the disk 112. The injector plate 502 has an inlet 506 into which ozone gas $O_3$ can be supplied into the injector plate 502, which is at least partially hollow to allow it to receive the ozone gas. The injector plate has a one or more (preferably a plurality) of openings 508 located adjacent to the surface of the disk 112 to allow the ozone gas to be emitted from the injector plate toward the surface of the disk 112. In FIG. 5, the openings 508 are shown in dashed line to indicate that they are at the bottom of the injector plate and are hidden there-beneath in FIG. 5. As shown in FIG. 5, the injector plate 502 is preferably located upstream of the pressure pad (relative to the direction of movement of the disk 408, and is more preferably located about 90 degrees from the location of the pressure pad 406.

It should be pointed out that, although the above process has been described in terms of polishing a magnetic media, the process could be used in other applications where a carbon surface is polishing and where a smooth surface free of carbon particle debris is desired.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a magnetic media for magnetic data recording, comprising:
    forming a disk having a magnetic recording layer and a carbon overcoat formed over the magnetic recording layer;
    polishing the carbon overcoat; and
    while polishing the carbon overcoat, exposing the surface of carbon overcoat to ozone, wherein the polishing is performed such that friction from the polishing generates heat that causes particles of carbon removed by the polishing to convert to $CO_2$ in the presence of the ozone.

2. The method as in claim 1 wherein the exposure of the carbon overcoat is performed at an upstream location relative to the polishing.

3. The method as in claim 1, wherein the polishing is performed using a polishing tape and wherein the exposure of the carbon overcoat to ozone includes introducing ozone to an interface between the carbon overcoat and the polishing tape.

4. The method as in claim 1 wherein the polishing is a dry polishing.

5. The method as in claim 1 wherein the polishing uses a polishing tape extending between first and second reels and a pressure pad arranged to press the polishing tape against the magnetic media.

6. The method as in claim 5 wherein the exposure of the carbon overcoat to ozone includes the use of a device for emitting ozone, the device being arranged in an upstream direction relative to a direction of movement of the magnetic media relative to the pressure pad.

7. The method as in claim 1 wherein the exposure of the carbon overcoat to ozone is performed using an ozone injector plate having a plurality of openings disposed toward the surface of the magnetic media.

8. The method as in claim 7 wherein the polishing is performed using a pressure pad and wherein the pressure pad and the injector plate are located about 90 degrees from one another with respect to a radial direction of the magnetic media.

9. The method as in claim 8 wherein the injector plate is located upstream from the pressure pad relative to a direction of movement of the magnetic media relative to the pressure pad.

10. The method as in claim 1, further comprising, before performing the polishing, oxidizing a surface of the carbon overcoat.

11. The method as in claim 10 wherein the oxidizing of the surface of the carbon overcoat further comprises exposing the surface of the carbon overcoat to ozone.

12. The method as in claim 10 wherein the oxidizing of the surface of the carbon overcoat further comprises exposing the surface of the carbon overcoat with ozone at ambient temperature.

13. The method as in claim 1 wherein the carbon overcoat is unoxidized prior to and during the polishing.

14. A method for polishing a carbon surface, comprising:
    polishing the carbon surface; and
    while polishing the carbon surface, exposing the carbon surface to ozone, wherein the polishing is performed such that friction from the polishing generates heat that causes particles of carbon removed by the polishing to convert to $CO_2$ in the presence of the ozone;
    wherein the polishing is performed using a polishing tape and wherein the exposure of the carbon surface to ozone includes introducing ozone to an interface between the carbon surface and the polishing tape.

15. The method as in claim 14 wherein the exposure of the carbon surface is performed at an upstream location relative to the polishing.

16. The method as in claim 14 wherein the polishing is a dry polishing.

* * * * *